(12) United States Patent  
Naulleau

(10) Patent No.: US 6,392,792 B1  
(45) Date of Patent: May 21, 2002

(54) METHOD OF FABRICATING REFLECTION-MODE EUV DIFFRACTION ELEMENTS

(75) Inventor: Patrick P. Naulleau, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/730,970

(22) Filed: Dec. 5, 2000

(51) Int. Cl.[7] .............................. G02B 5/20; G02B 5/18; G02B 1/10; B29D 11/00
(52) U.S. Cl. ........................ 359/360; 359/566; 359/572; 359/576; 359/584; 359/585; 359/900; 216/2; 216/24; 216/41
(58) Field of Search ....................... 216/2, 24, 41, 216/26, 47; 359/565, 576, 350, 359, 360, 366, 369, 572, 900, 584, 585, 586; 378/34, 35

(56) References Cited

U.S. PATENT DOCUMENTS

| 3,542,453 | A | * | 11/1970 | Kantor .................... 216/24 |
| 4,746,192 | A | * | 5/1988 | Minagawa ................. 359/576 |
| 4,895,790 | A | | 1/1990 | Swanson et al. ............ 430/321 |
| 4,915,463 | A | | 4/1990 | Barbee, Jr. ................ 359/568 |
| 5,257,132 | A | * | 10/1993 | Ceglio et al. .............. 359/565 |
| 5,422,753 | A | | 6/1995 | Harris ..................... 359/569 |
| 5,638,212 | A | | 6/1997 | Meyers et al. .............. 359/569 |
| 5,737,125 | A | | 4/1998 | Ohashi ..................... 359/565 |
| 5,795,684 | A | | 8/1998 | Troccolo ................... 430/5 |
| 5,907,436 | A | | 5/1999 | Perry et al. ................ 359/576 |
| 5,935,733 | A | | 8/1999 | Scott et al. ................. 430/5 |
| 5,935,737 | A | | 8/1999 | Yan ......................... 430/5 |
| 5,958,629 | A | | 9/1999 | Yan et al. .................. 430/5 |
| 5,962,174 | A | | 10/1999 | Pierrat ..................... 430/5 |
| 6,187,211 | B1 | * | 2/2001 | Smith et al. ................ 216/24 |

FOREIGN PATENT DOCUMENTS

JP 06-258510 A * 9/1994

* cited by examiner

Primary Examiner—Cassandra Spyrou  
Assistant Examiner—John Juba, Jr.  
(74) Attorney, Agent, or Firm—Burns, Doane, Swecker & Mathis, LLP

(57) ABSTRACT

Techniques for fabricating a well-controlled, quantized-level, engineered surface that serves as substrates for EUV reflection multilayer overcomes problems associated with the fabrication of reflective EUV diffraction elements. The technique when employed to fabricate an EUV diffraction element that includes the steps of: (a) forming an etch stack comprising alternating layers of first and second materials on a substrate surface where the two material can provide relative etch selectivity; (b) creating a relief profile in the etch stack wherein the relief profile has a defined contour; and (c) depositing a multilayer reflection film over the relief profile wherein the film has an outer contour that substantially matches that of the relief profile. For a typical EUV multilayer, if the features on the substrate are larger than 50 nm, the multilayer will be conformal to the substrate. Thus, the phase imparted to the reflected wavefront will closely match that geometrically set by the surface height profile.

34 Claims, 2 Drawing Sheets

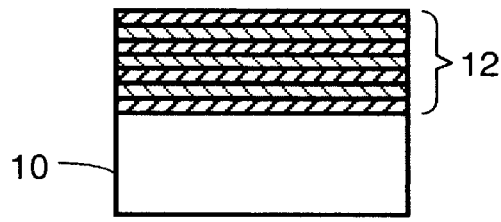
FIG._1.
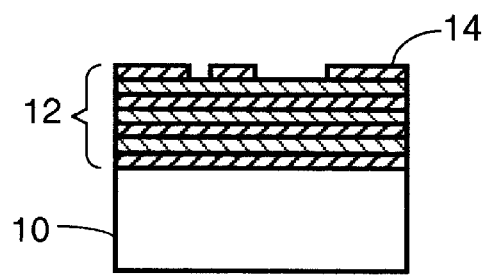
FIG._2A.
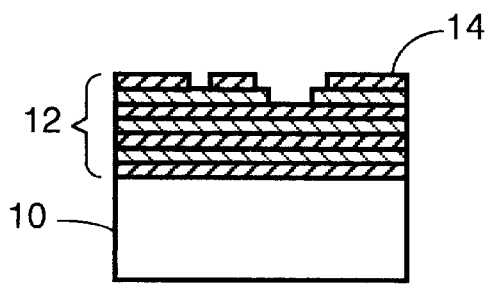
FIG._2B.
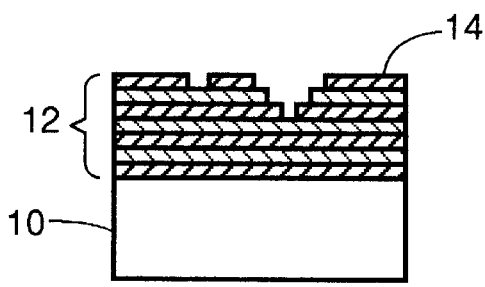
FIG._2C.

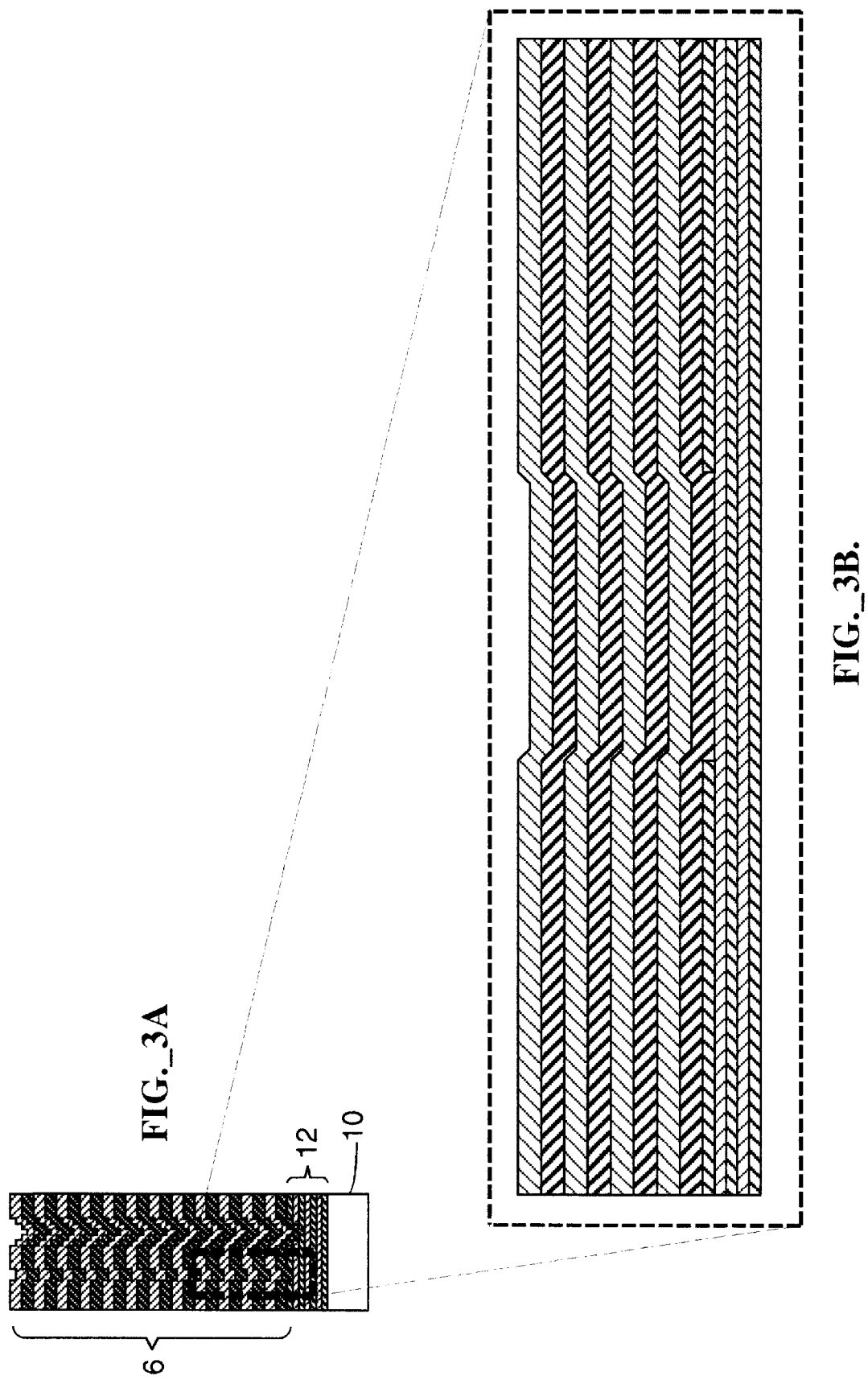

METHOD OF FABRICATING REFLECTION-MODE EUV DIFFRACTION ELEMENTS

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

The invention relates to high-efficiency multilevel diffractive optical elements and particularly to fabrication techniques that produce arbitrary multilevel-phase diffraction elements for reflection mode EUV devices.

BACKGROUND OF THE INVENTION

Multilevel-phase diffraction elements play a very important role in the realm of the optics. Examples of such devices include diffusers, kinoforms, and phase grating such as sinusoidal and blazed gratings. With the advent of multilayer reflectors, optical systems have been pushing towards evershorter wavelengths.

Currently, most EUV diffraction elements are of the binary amplitude type, which severely limits their flexibility. Theoretically, on-axis diffractive phase elements consisting of a grating having a given period can achieve 100 percent diffraction efficiency. To achieve this efficiency, however, a continuous phase profile within any given period is necessary. The theoretical diffraction efficiency of this surface profile is also relatively sensitive to a change in wavelength. The technology for producing high quality, high efficiency, continuous-phase-profile reflection diffractive elements working at EUV wavelengths does not presently exist.

A compromise that results in a relatively high diffraction efficiency and ease of fabrication is a multilevel phase grating. The larger the number of discrete phase levels, the better the approximation of the continuous phase function. The multilevel phase surface profiles of the grating can be fabricated using standard, semiconductor integrated circuit fabrication techniques.

A typical binary optics fabrication process starts with a mathematical phase description of a diffractive phase profile and results in a fabricated multilevel diffractive surface. The next step is to transfer the phase profile information into the substrate. This can be achieved through a variety of methods including conventional and electron-beam lithography methods. Typically this is done by decomposing the desired multilevel pattern into a series of binary patterns and performing multiple lithography steps.

A substrate of the desired material, such as silicon or glass, is coated with a thin layer of photoresist. A first pattern is transferred to the photoresist using a standard lithography technique such as, for example, projection, contact, or electron-beam lithography. The photoresist is developed, washing away the exposed resist and leaving the binary pattern in the remaining photoresist. This photoresist will act as an etch stop.

A reliable and accurate way to etch typical substrate materials is reactive ion etching. The process of reactive ion etching anisotropically etches material at very repeatable rates. The desired etch depth can be obtained very accurately. The anisotropic nature of the process assures a vertical etch, resulting in a true binary surface relief profile. Once the substrate has been reactively ion etched to the desired depth, the remaining photoresist is stripped away, leaving a binary surface relief phase grating.

The process may then be repeated using the next binary pattern. The partially patterned substrate is recoated with photoresist and exposed using the second binary pattern, which has half the period of the first mask. After developing and washing away the exposed photoresist, the substrate is reactively ion etched to a depth half that of the first etch. Removal of the remaining photoresist results in a 4 level approximation to the desired profile. The process may be repeated a third and fourth time with binary patterns having periods of one-quarter and one eighth that of the first mask, and etching the substrates to depths of one-quarter and one-eighth that of the first etch. The successive etches result in elements having 8 and 16 phase levels. More masks than four might be used, however, fabrication errors tend to predominate as more masks are used.

This process produces a multilevel surface relief structure in the substrate. The result is a discrete structure approximating the original idealized diffractive surface. For each additional lithography step used in the fabrication process, the number of discrete phase levels is doubled.

After only four processing iterations, a 16 phase level approximation to the continuous case can be obtained. The process can be carried out in parallel, producing many elements simultaneously, in a cost-effective manner.

A 16 phase level structure can theoretically achieve 99 percent diffraction efficiency. The residual 1 percent of the light is diffracted into higher orders and manifests itself as scatter. In many optical systems, this is a tolerable amount of scatter. The fabrication of the 16 phase level structure is relatively efficient due to the fact that only four processing iterations are required to produce the element.

Binary optical elements have a number of advantages over conventional optics. Because they are computer generated, these elements can perform more generalized wavefront shaping than conventional lenses or mirrors. Elements need only be mathematically defined: no reference surface is necessary. Therefore, wildly, asymmetric binary optics are able to correct aberrations in complex optical systems, and elements can be made wavelength-sensitive for special laser systems.

Recently, extreme ultraviolet (EUV) wavelength systems have attracted significant interest due to their applicability to next-generation projection lithography for semiconductor manufacturing. It would be highly desirable to have multilevel-phase diffraction elements that work at EUV wavelengths. Efficiency concern generally limit these EUV devices to being reflection devices because of the significant attenuation imparted by all materials upon transmission on EUV light through the material. Unfortunately, the method described above is not well suited for the fabrication of these reflection devices at EUV wavelengths. The problem is in the extremely high tolerances required of the individual step heights. For an 8-level near-normal incidence reflective EUV diffraction element the step height control would have to be a small fraction of a nanometer. Such etch control is extremely difficult to achieve in practice. The present invention describes a method well-suited to the fabrication of reflective EUV diffraction elements.

SUMMARY OF THE PRESENT INVENTION

The present invention is directed to techniques for fabricating reflective EUV diffraction elements. This goal is achieved by fabricating a well-controlled, quantized-level, engineered surface, which is subsequently overcoated with a conventional EUV reflection multilayer. For a typical EUV multilayer, if the features on the substrate are larger than 50 nm, the overcoated multilayer will be conformal to the substrate. Thus, the phase imparted to the reflected wavefront will closely match that geometrically set by the surface height profile. This avoids the difficulties involved in trying to directly pattern into the reflective EUV multilayer and allows the deposited multilayer to effectively smooth out high-frequency (undesired) roughness which may be present on the patterned substrate.

Accordingly, one embodiment the invention is directed to a method of fabricating an EUV diffraction element that includes the steps of:

(a) forming an etch stack comprising alternating layers of first and second materials on a substrate surface where the two material can provide relative etch selectivity;

(b) creating a relief profile in the etch stack wherein the relief profile has a defined contour; and (c) depositing a multilayer reflection film over the relief profile wherein the film has an outer contour that substantially matches that of the relief profile.

In a preferred embodiment, step (b) includes forming a relief profile having at least three levels wherein each level is formed by:

(i) forming a resist film on top of the stack;

(ii) exposing one or more patterned regions and developing to uncover one or more regions of the stack;

(iii) etching one layer of the stack where uncovered of resist; and (iv) repeating steps (i) through (iii) at least once up to the number of stack layers available.

In another preferred embodiment, the multilayer reflection film comprises alternating layers of a third material having a refractive index and a fourth material having a refractive index that is larger than that of the third material.

In yet another embodiment, the invention is directed to an EUV device including a multilevel diffraction element that includes:

(a) a substrate having a stack comprising alternating layers of first and second materials on a substrate surface wherein the stack defines a relief profile having a desired contour; and (b) a multilayer reflection film that covers the relief profile wherein the film has a contour that substantially matches that of the relief profile.

BRIEF DESCRIPTION OF THE DRAWINGS

FIG. 1 illustrates a substrate having a multilayer stack deposited thereon;

FIGS. 2A, 2B, and 2C illustrate multiple pattern-and-etch steps employed to define arbitrary profile; and FIGS. 3A and 3B illustrate an inventive multilayer reflection stack matched to the wavelength of interest.

DETAILED DESCRIPTION OF THE PREFERRED EMBODIMENT

FIG. 1 illustrates a multilayer stack 12 that is deposited on the upper surface of substrate 10. The layers in the stack preferably comprise alternating layers of two different materials that can be etched by conventional techniques and that exhibit good etch selectivity properties. Each stack layer provides a natural etch stop allowing accurate step heights to be achieved. This natural etch stop removes the burden of extremely high accuracy etch control plaguing the application of standard optical methods described above to the EUV problem of interest here. Extremely high accuracy thin-film and multilayer deposition techniques exist making the step-height control relatively easy to achieve. Modern deposition technology yields step height control on the order of 0.1% peak-to-valley for films with bilayer periods of approximately 7 nm. This accuracy well exceeds the requirements for high-efficiency quantized-level reflective EUV diffraction elements.

Preferred materials for the etch-control stack include, for example, silicon and silicon dioxide. The substrate 10 serves as a support and can be made of any suitable superflat (<3 Angstrom rms roughness) material including, for example, silicon or glass.

In the embodiment shown in FIG. 1, the multilayer stack 12 has seven layers which provide for a total of eight possible height levels. Typically, the number of layers will range from about 3 to 31 and preferably 7 to 15. The thickness of each layer will typically range from 1 nm to 20 nm. The heights of the layers are preferably substantially equal. The alternating layers are deposited by conventional techniques such as magnetron or ion-beam sputtering, thermal evaporation, electron beam deposition, or electroless chemical deposition.

FIGS. 2A, 2B, and 2C show the formation of an arbitrary relief profile following three pattern-and-etch steps into the etch stack 12 shown in FIG. 1. In FIG. 2A, a profile is formed on top layer 14, which has the effect of creating a two-level phase profile. Subsequently, a three-level phase and a four-phase profile are formed as shown in FIGS. 2B and 2C, respectively. The first profile as illustrated in FIG. 2A is produced by standard binary element fabrication techniques wherein a layer of photoresist is coated over layer 14. A lithography method (such as electron-beam lithography) is then used to transfer the first pattern to the photoresist. Thereafter, the photoresist is developed which results in a patterned layer of photoresist which acts as an etch mask for subsequent etching using, for example, reactive ion etching (RIE). After the first pattern has been etched into layer 14, any residual photoresist and material of layer 14 are stripped away leaving the structure shown in FIG. 2A. The same technique is repeated to achieve the structures shown in FIGS. 2B and 2C.

The multiple pattern-and-etch procedure illustrated in FIGS. 2A, 2B, and 2C creates an arbitrary relief profile within the etch stack 12. Typically, 8 to 16 levels are more than sufficient to approximate the performance of a continuous phase device. Because the two materials used (e.g., silicon and silicon dioxide) to form multilayer 12 have good etch selectivity properties, the application of current coating technologies allow for atomic level thickness control thereby permitting good step height accuracy. For a near-normal incidence EUV diffuser, the step heights should be in the order of about 3 nm and the step height control should be better than 10%.

FIG. 3A shows an overcoat of a multilayer reflection stack 16 that is formed over the structure of FIG. 2C. It is important to note that the scale of the figure is greatly exaggerated for clarity; in reality the lateral feature size will be on the order of 100 times larger than the step height. For example in a typical EUV diffuser, the step height might be 3 nm whereas the lateral feature size would be about 300 nm. FIG. 3B is a view of a portion of the multilayer reflection stack depicting the features in a more to realistic scale.

The multilayer reflection stack 16 is designed to reflect at the wavelength of interest and is formed of alternating layers of two or more materials. Preferred materials include, for example, molybdenum (Mo), silicon (Si), tungsten (W), carbon (C), beryllium (Be), ruthenium (Ru), $B_4C$, $Mo_2C$, titanium (Ti), and vanadium (V). Preferred stacks are formed from alternating layers of two materials that are selected from the following list of seven pairs: Mo—Si, W—C, Mo—Be, Ru—$B_4C$, $Mo_2C$—Si, Ti—C, V—C. Alternating layers of Mo and Si are particularly preferred for EUV applications (e.g., on the order of 10 nm). The individual layers of the multilayer stack 16 are formed by conventional techniques such as those employed for forming the individual layers of etch stack 12 (FIG. 1) described above.

It is understood that the number of bilayers in the reflective multilayer can vary depending on the desired performance in terms of wavelength and angular and temporal bandwidth. A larger number of layers will provide higher reflectivity at the cost of lower angular and temporal bandwidth. Overcoat 16 of FIG. 3A is depicted to have 10 bilayers. Typically, the number of layered pairs will range from about 10 to 200 and preferably from about 20 to 80. Moreover, the layer pairs will typically have a bilayer periodicity of about 2 nm to 100 nm and preferably from about 5 nm to 30 nm. By "periodicity" is meant the thickness of one bilayer. Typically, the height of the individual stack layers will range from about 0.2 to 0.8 times the total bilayer thickness and preferably from about 0.4 to 0.6 times the total bilayer thickness.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of fabricating an EUV diffraction element comprising:
   (a) forming an etch stack comprising alternating layers of first and second materials on a substrate surface where the two materials can provide relative etch selectivity;
   (b) creating a relief profile in the etch stack wherein the relief profile has a defined contour and the relief profile has at least three levels wherein each level is formed by:
      (i) forming a resist film on top of the stack;
      (ii) exposing one or more patterned regions and developing to uncover one or more regions of the stack;
      (iii) etching one layer of the stack where uncovered of resist; and
      (iv) repeating steps (i) through (iii) at least once up to the number of stack layers available; and
   (c) depositing a multilayer reflection film over the relief profile wherein the film has an outer contour that substantially matches that of the relief profile.

2. The method of claim 1 wherein the multilayer reflection film comprises alternating layers of a third material having a refractive index and a fourth material having a refractive index that is larger than that of the third material.

3. The method of claim 1 wherein the multilayer reflection film comprises about 10 to 200 layer pairs.

4. The method of claim 3 wherein the layer pairs have a periodicity of about 2 nm to 100 nm.

5. The method of claim 1 wherein the multilayer reflection film comprises alternating layers of molybdenum and silicon.

6. The method of claim 5 wherein the multilayer reflection film comprises about 10 to 200 layer pairs.

7. The method of claim 6 wherein the layer pairs have a periodicity of about 2 nm to 100 nm.

8. The method of claim 1 wherein the multilayer reflection film is formed of material selected from the group consisting of Mo—Si, W—C, Mo—Be, Ru—$B_4C$, $Mo_2C$—Si, Ti—C, V—C.

9. The method of claim 8 wherein the multilayer reflection film comprises about 10 to 200 layer pairs.

10. The method of claim 9 wherein the layer pairs have a periodicity of about 2 nm to 100 nm.

11. The method of claim 1 wherein the etch stack is made up of Si and $SiO_2$.

12. The method of claim 1 wherein the heights of the individual etch stack layers ranges from 1 nm to 20 nm.

13. The method of claim 1 wherein the number of layers in the etch stack lies in the range of about 3 to 31.

14. An EUV device including a multilevel reflective diffraction element that comprises:
   (a) a substrate having an etch stack comprising alternating layers of Si and $SiO_2$ on a substrate surface wherein the etch stack defines a relief profile having a desired contour; and
   (b) a multilayer reflection film that covers the relief profile wherein the film has a contour that substantially matches that of the relief profile.

15. The device of claim 14 wherein the multilayer reflection film comprises alternating layers of a third material having a refractive index and a fourth material having a refractive index that is larger than that of the third material.

16. The device of claim 14 wherein the multilayer reflection film comprises alternating layers of molybdenum and silicon.

17. The device of claim 16 wherein the multilayer reflection film comprises about 10 to 200 layer pairs.

18. The device of claim 17 wherein the layer pairs have a periodicity of about 2 nm to 100 nm.

19. The device of claim 14 wherein the multilayer reflection film comprises about 10 to 200 layer pairs.

20. The device of claim 19 wherein the layer pairs have a periodicity of about 2 nm to 100 nm.

21. The device of claim 14 wherein the multilayer reflection film is formed of material selected from the group consisting of Mo—Si, W—C, Mo—Be, Ru—$B_4C$, $Mo_2C$—Si, Ti—C, V—C.

22. The device of claim 21 wherein the multilayer reflection film comprises about 10 to 200 layer pairs.

23. The device of claim 22 wherein the layer pairs have a periodicity of about 2 nm to 100 nm.

24. The device of claim 14 wherein the heights of the individual etch stack layers ranges from 1 nm to 20 nm.

25. The device of claim 14 wherein the number of layers in the etch stack lies in the range of about 3 to 31.

26. A method of fabricating an EUV diffraction element comprising:
   (a) forming an etch stack comprising alternating layers of Si and $SiO_2$ on a substrate surface;
   (b) creating a relief profile in the etch stack wherein the relief profile has a defined contour; and
   (c) depositing a multilayer reflection film over the relief profile wherein the film has an outer contour that substantially matches that of the relief profile.

27. The method of claim 26 wherein the heights of the individual etch stack layers ranges from 1 nm to 20 nm.

28. The method of claim 27 wherein the number of layers in the etch stack lies in the range of about 3 to 31.

29. A method of fabricating an EUV diffraction element comprising:
   (a) forming an etch stack comprising alternating layers of first and second materials on a substrate surface where the two materials can provide relative etch selectivity wherein the heights of the individual etch stack layers ranges from 1 nm to 20 nm;

(b) creating a relief profile in the etch stack wherein the relief profile has a defined contour; and (c) depositing a multilayer reflection film over the relief profile wherein the film has an outer contour that substantially matches that of the relief profile.

30. The method of claim 29 wherein the number of layers in the etch stack lies in the range of about 3 to 31.

31. A method of fabricating an EUV diffraction element comprising:

(a) forming an etch stack comprising alternating layers of first and second materials on a substrate surface where the two materials can provide relative etch selectivity wherein the number of layers in the etch stack lies in the ranges of about 3 to 31;

(b) creating a relief profile in the etch stack wherein the relief profile has a defined contour; and (c) depositing a multilayer reflection film over the relief profile wherein the film has an outer contour that substantially matches that of the relief profile.

32. An EUV device including a multilevel reflective diffraction element that comprises:

(a) a substrate having an etch stack comprising alternating layers of first and second materials on a substrate surface wherein the etch stack defines a relief profile having a desired contour and wherein the heights of the individual etch stack layers ranges from 1 nm to 20 nm; and (b) a multilayer reflection film that covers the relief profile wherein the film has a contour that substantially matches that of the relief profile.

33. The device of claim 32 wherein the number of layers in the etch stack lies in the range of about 3 to 31.

34. An EUV device including a multilevel reflective diffraction element that comprises:

(a) a substrate having an etch stack comprising alternating layers of first and second materials on a substrate surface wherein the etch stack defines a relief profile having a desired contour and wherein the number of layers in the etch stack lies in the range of about 3 to 31; and (b) a multilayer reflection film that covers the relief profile wherein the film has a contour that substantially matches that of the relief profile.

* * * * *